United States Patent [19]
Butler

[11] Patent Number: 6,000,132
[45] Date of Patent: *Dec. 14, 1999

[54] METHOD OF FORMING HEAT DISSIPATING FINS

[75] Inventor: James R. S. Butler, Oakville, Canada

[73] Assignee: R-Theta Inc., Mississauga Ontario, Canada

[*] Notice: This patent issued on a continued prosecution application filed under 37 CFR 1.53(d), and is subject to the twenty year patent term provisions of 35 U.S.C. 154(a)(2).

[21] Appl. No.: 08/980,592

[22] Filed: Dec. 1, 1997

[51] Int. Cl.$^6$ ................................................. B23P 15/26
[52] U.S. Cl. ........................... 29/890.03; 29/521; 29/557
[58] Field of Search .................. 165/80.3, 185; 174/16.3; 257/722; 361/704, 703; 29/890.03, 521, 505, 557

[56] References Cited

U.S. PATENT DOCUMENTS

| | | |
|---|---|---|
| 4,879,891 | 11/1989 | Hinshaw . |
| 4,884,331 | 12/1989 | Hinshaw . |
| 5,014,776 | 5/1991 | Hess ........................................ 165/185 |
| 5,351,748 | 10/1994 | Dagan . |
| 5,381,859 | 1/1995 | Minakami ............................. 165/80.3 |
| 5,406,698 | 4/1995 | Lipinski . |
| 5,419,041 | 5/1995 | Ozeki . |
| 5,421,406 | 6/1995 | Furusawa . |
| 5,499,450 | 3/1996 | Jacoby . |
| 5,542,176 | 8/1996 | Serizawa et al. .................. 165/185 X |
| 5,590,712 | 1/1997 | Fisher et al. ............................ 165/185 |

FOREIGN PATENT DOCUMENTS

| 49644 | 2/1992 | Japan ..................................... 257/722 |
|---|---|---|

*Primary Examiner*—I. Cuda
*Attorney, Agent, or Firm*—Townsend and Townsend and Crew LLP; Guy W. Chambers

[57] ABSTRACT

A method of fabricating a heat sink, including the steps of providing a base plate having a plurality of grooves therein, providing a plurality of blanks each having bell-bottom shaped foot portions on opposite sides thereof, separating each blank into a pair of mirror image heat fin portions, each of the heat fin portions having one of the bell-bottom shaped foot portions and a plurality of tongues projecting therefrom, positioning the heat sink fin portions with the bell-bottom shaped foot portions in respective ones of the grooves of the base plate, and swaging the bell-bottom shaped foot portions into the grooves, thereby creating the heat sink with the tongues projecting from the base plate.

6 Claims, 3 Drawing Sheets

METHOD OF FORMING HEAT DISSIPATING FINS

FIELD OF THE INVENTION

The present invention relates in general to heat sinks and more particularly to a method of forming heat dissipating fins for an air cooled heat sink.

BACKGROUND OF THE INVENTION

Air cooled heat sinks are known in the art for dissipating heat from electronic components. One variety of such heat sinks comprises a block of heat conductive metal (e.g. aluminum) on one side of which heat generating electronic components are connected, and on an opposite side of which are provided a plurality of rectangular fins which create a large heat exchange surface for dissipating heat to the ambient air.

U.S. Pat. Nos. 4,884,331 and 4,879,891 (both assigned to Thermaloy Incorporated) show such a prior art heatsink designs. These patents teach the ratio of height of the fins to the width of the grooves therebetween may be increased by sawing the grooves with an appropriate sawing device to provide gang sawing of all of the grooves simultaneously.

U.S. Pat. No. 5,406,698 (Lipinski) discloses a method and apparatus for fabricating heat sinks wherein a block of aluminum is extruded with a plurality of grooves and a plurality of fins having bell-bottom shaped foot portions are swaged into the grooves.

Wire fin and pin fin heat sinks are also known in the art in accordance with which serpentine wires, square fins and cylindrical pins, replace the rectangular fins discussed above. The increased air circulation around these heat exchange surfaces results in greater heat dissipating efficiency than prior art rectangular fin heat sinks.

A method for manufacturing a multiple pin heat sink is set forth in U.S. Pat. No. 5,499,450 (Jacoby) in which a dye member is utilised for forming the pin elements.

U.S. Pat. No. 5,351,748 (Dagan) also discloses a pin fin heat sink comprising a base with an array of tubular pins extending outwardly therefrom. The pins are engaged with apertures recessed into the base by means of an expansion member (e.g. ball bearing) positioned within a tubular portion of each pin, wherein the expansion member causes the wall of the pin to deform outwardly to clampingly engage the pin within the aperture.

It is also known in the art to create pin-fin style heat sinks using fins cut or stamped to form a plurality of pin-like fingers.

For example, U.S. Pat. No. , 5,421,406 (Furusawa et al) discloses fabrication of "comb-like" pin fins for use in a heat sink. The fins are stamped or blanked out from a metal sheet.

U.S. Pat. No. 5,419,051 (Ozeki) also teaches "comb-like" pin fins for use in a heat sink. According to this patent, the fins are stamped out to form slits.

U.S. Pat. No. 5,381,859 (Minakami et al) also discloses fabrication of a plurality of fins which are stamped out to form slits which may be rotated relative to adjacent heat sink fin elements so as to form a three dimensional matrix of pin fins.

SUMMARY OF THE INVENTION

In accordance with the present invention, a generally rectangular fin is extruded with a "bell-bottom" foot on opposite edges. This fin is then punched or sheared in a crenellated or "zig-zag" pattern to form a pair of offset fins. The fins are then swaged into a base plate to form a pin fin style of heat sink with aligned tongues and intermediate slots in adjacent fins. According to an alternative embodiment, the fins are arranged so as to provide offset tongues and slots.

The new technique results in approximately 40% savings in weight over prior art rectangular fin heat sinks with the same heat dissipating characteristics as prior art pin fin devices. Although several of the above-referenced patents disclose the general concept of stamping or cutting a sheet of metal to emulate a pin-fin heat sink arrangement, none of the references disclose extrusion of a sheet having opposite bell-bottom foot portions in combination with a crenellated cut line for fabricating a pair of identical heat-sink fins from a single blank, as provided by the present invention.

BRIEF DESCRIPTION OF THE DRAWINGS

A detailed description of a preferred embodiment of the invention is provided herein below, with reference to the following drawings, in which.

DETAILED DESCRIPTION OF THE PREFERRED EMBODIMENT

Figure 1A:
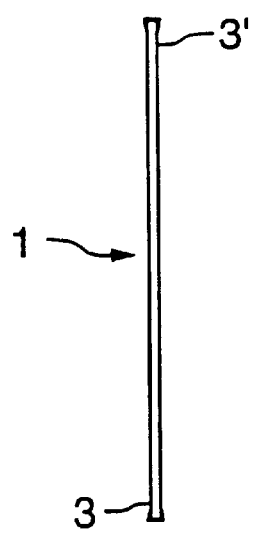
FIGS. 1A and 1B are side and plan views, respectively of a blank from which a pair of heat sink fins are fabricated in accordance with the invention.
Figure 1B:
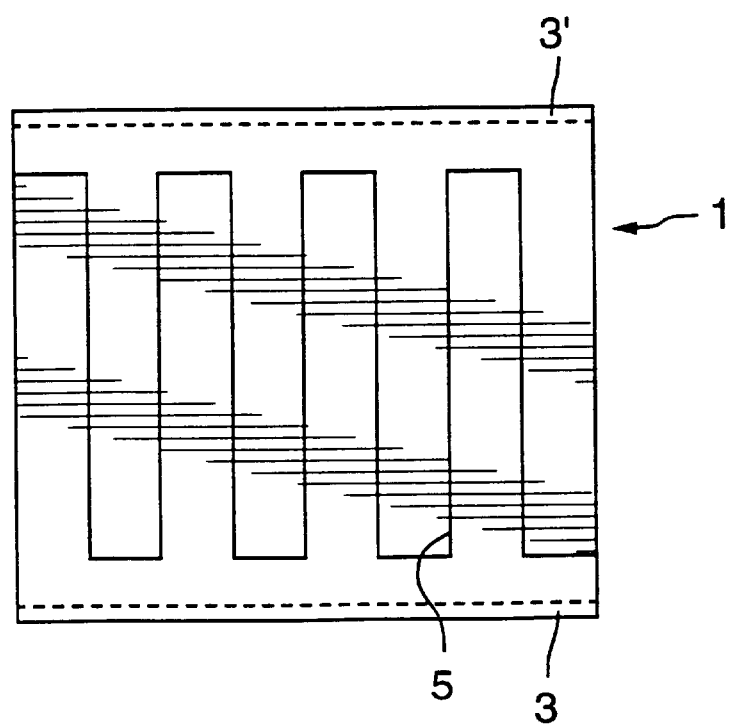
Figure 2A:
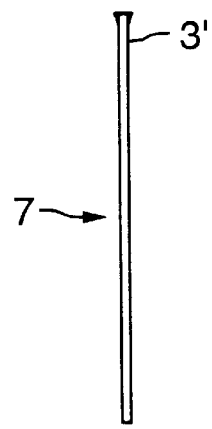
FIGS. 2A and 2B are side and plan views, respectively of a first heat sink fin fabricated from the blank of FIG. 1 in accordance with the invention.
Figure 2B:
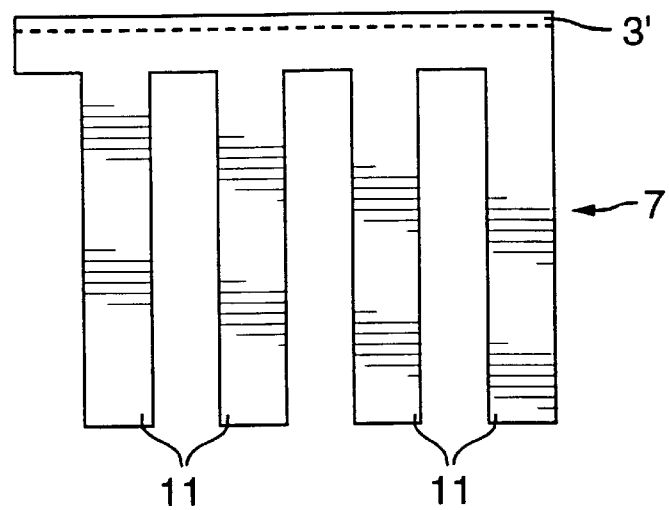
Figure 2C:
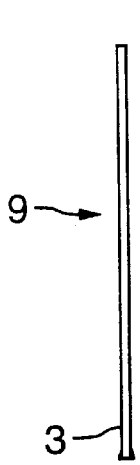
FIGS. 2C and 2D are side and plan views, respectively of a second heat sink fin fabricated from the blank of FIG. 1 in accordance with the invention.
Figure 2D:
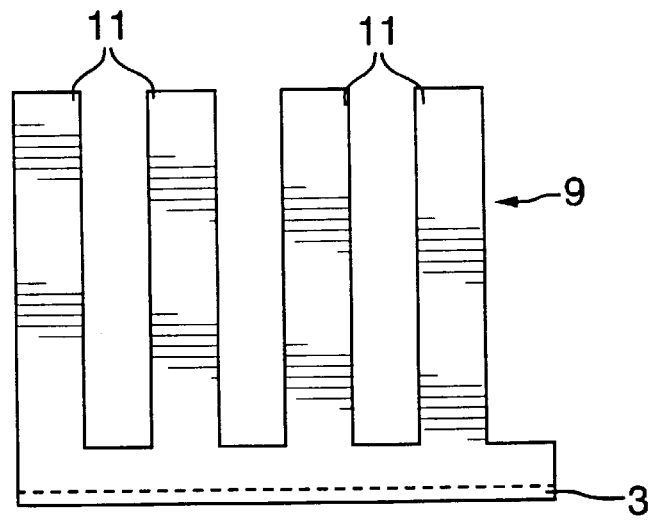

Turning to Figures 1A and 1B, a generally rectangular blank 1 of suitable heat conductive material (e.g. aluminum) is provided through extrusion or other process with "bell-bottom" shaped foot portions 3 and 3' on opposite sides thereof. A crenellated scribe line 5 is shown in FIG. 1B along which the blank 1 is punched or sheared to provide two mirror-image heat sink fins 7 and 9, as shown in FIGS. 2A to 2D. Each heat sink fin 7 and 9 comprises a bell-bottom foot portion (foot portion 3' in the fin 7 (FIG. 2B) and foot portion 3 in the fin 9 (FIG. 2D)), and a plurality of tongues 11 which emulate the structure of prior art wire fins or pin fins.

Although the scribe line 5 is depicted to illustrate the pattern for the shearing or punching of blank 1, in practice no such line is required to be actually drawn on the blank 1. The shearing or punching step can be carried out using well known punch presses or shearing machines, the construction of which do not form part of the present invention.

Figure 3:
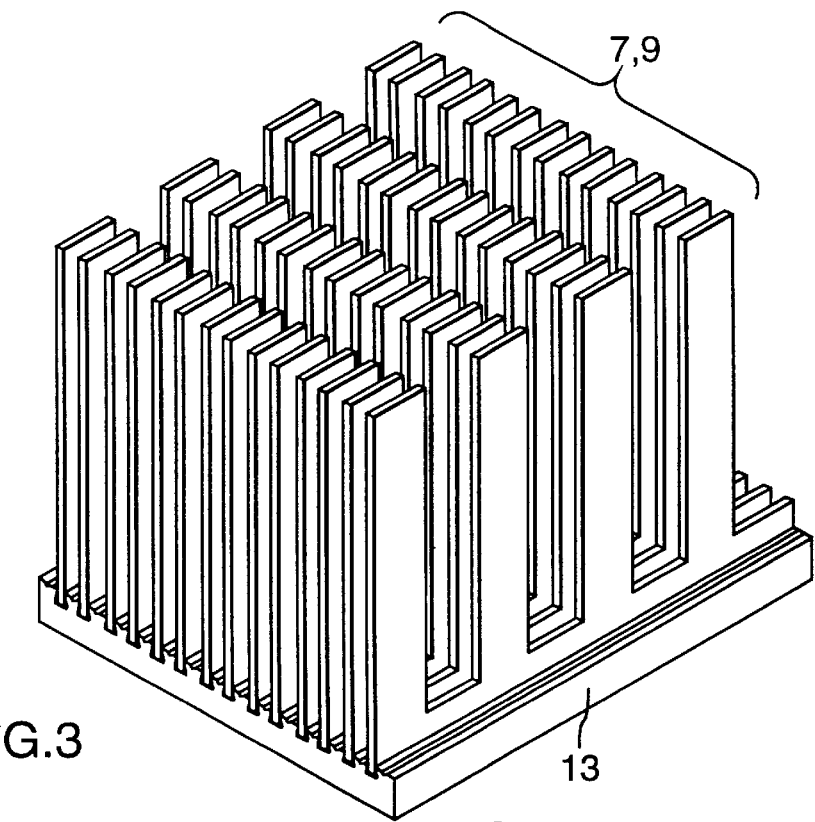
FIG. 3 is a perspective view of a heat sink assembled from a plurality of heat sink fins, in accordance with the preferred embodiment.
Figure 4:
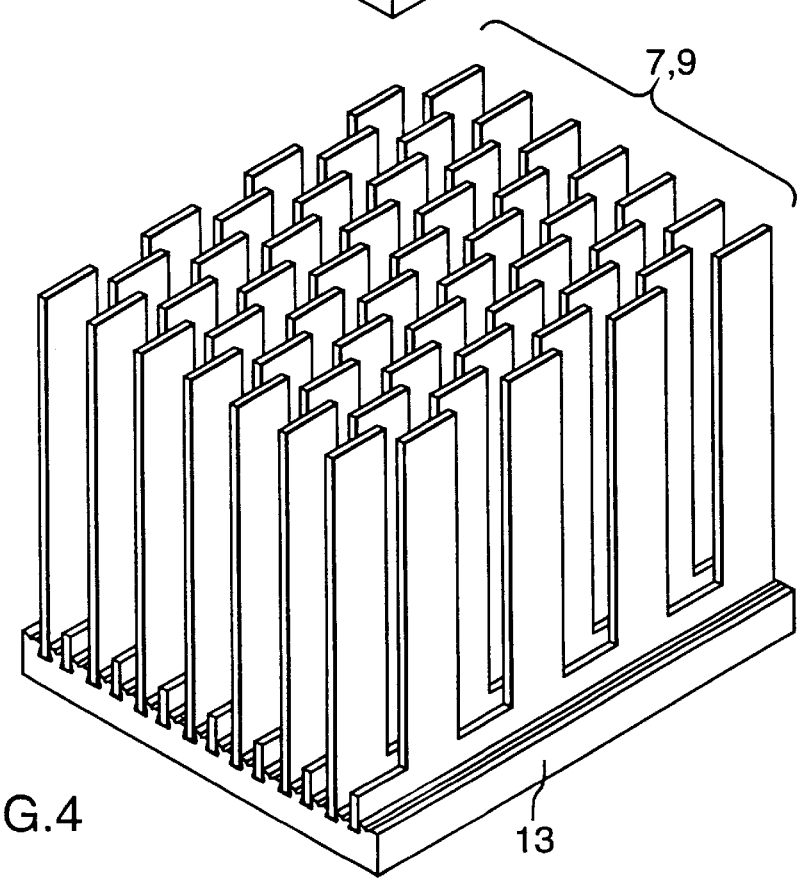
FIG. 4 is a perspective view of a heat sink assembled from a plurality of heat sink fins, in accordance with an alternative embodiment of the invention.

As shown in FIGS. 3 and 4, foot portions 3 and 3' are received within cooperatively shaped grooves of an extruded base plate 13 and subsequently swaged in accordance with the principles set forth in commonly-owned U.S. Pat. No. 5,406,698 (Lipinski) to form the heat sink structure of the preferred embodiment (FIG. 3) with aligned tongue portions 11, or the structure of an alternative embodiment (FIG. 4) wherein the tongues 11 are offset or staggered relative to one another.

The heat sink structures of FIGS. 3 and 4, fabricated according to the method of the present invention, provide increased thermal performance and reduced weight characterized by prior art pin fin or wire fin heat sinks, relative to prior art rectangular fin heat sinks. Furthermore, by fabricating two fins 7 and 9 from a single blank 1, the heat sink of the present invention is less costly to produce and results in less waste material than prior art rectangular fin heat sinks, yet can be fabricated using the simplified swaging operation of U.S. Pat. No. 5,406,698 (Lipinski), the contents of which are incorporated herein by reference.

Alternative embodiments and modification are possible. Whereas, the exemplary embodiments illustrated in the drawings incorporate four tongues per fin 7 or 9, in practice the number of tongues may be selected to conform to any required size of heat sink. Also, whereas the preferred embodiment of FIG. 3 shows aligned tongues 11 and the alternative embodiment of FIG. 4 shown an alternating pattern of offset tongues 11, in practice some applications may require a combination of aligned and offset tongues 11. All such modifications and alternative embodiments are well within the understanding of a person skilled in the art and are believed to be within the sphere and scope of the invention as set forth in the claims appended hereto.

I claim:

1. A method of fabricating a heat sink, comprising the steps of:
   a) providing a base plate having a plurality of grooves therein;
   b) providing a plurality of blanks each having bell-bottom shaped foot portions on opposite sides thereof;
   c) separating each said blank into a pair of mirror image heat fin portions, each of said heat fin portions having one of said bell-bottom shaped foot portions and a plurality of tongues projecting therefrom;
   d) positioning said heat sink fin portions with said bell-bottom shaped foot portions in respective ones of said grooves of said base plate; and
   e) swaging said bell-bottom shaped foot portions into said grooves, thereby creating said heat sink with said tongues projecting from said base plate.

2. The method of claim 1, wherein said step of providing said base plate further comprises extruding said base plate with said grooves therein from a heat conductive metal.

3. The method of claim 1, wherein said step of providing said plurality of blanks further comprises extruding said blanks with said bell-bottom shaped foot portions thereon from a heat conductive metal.

4. The method of claim 1, wherein said step of separating each said blank into said pair of mirror image heat fin portions further comprises one of either shearing or punching said blank along a crenellated scribe line.

5. The method of claim 1, wherein said heat sink fins are positioned such that successive ones of said tongues projecting from said base plate are aligned.

6. The method of claim 1, wherein said heat sink fins are positioned such that successive ones of said tongues projecting from said base plate are offset.

* * * * *